US005707692A

United States Patent [19]
Suzuki

[11] Patent Number: 5,707,692
[45] Date of Patent: Jan. 13, 1998

[54] APPARATUS AND METHOD FOR PROCESSING A BASE SUBSTANCE USING PLASMA AND A MAGNETIC FIELD

[75] Inventor: Nobumasa Suzuki, Yokohama, Japan

[73] Assignee: Canon Kabushiki Kaisha, Tokyo, Japan

[21] Appl. No.: 320,551

[22] Filed: Oct. 11, 1994

Related U.S. Application Data

[63] Continuation of Ser. No. 83,877, Jun. 30, 1993, which is a continuation of Ser. No. 957,059, Oct. 6, 1992, abandoned, which is a continuation of Ser. No. 781,577, Oct. 23, 1991, abandoned.

[30] Foreign Application Priority Data

Oct. 23, 1990 [JP] Japan ................... 2-283469
Oct. 24, 1990 [JP] Japan ................... 2-284296

[51] Int. Cl.$^6$ .............. B05D 3/00; H05H 1/02; C23C 14/00

[52] U.S. Cl. .......... 427/562; 427/572; 427/535; 427/571; 216/71; 118/723 E; 118/723 ER; 118/723 I; 118/723 IR

[58] Field of Search ............... 427/571, 572, 427/569, 570, 536, 535, 537, 538, 539, 562, 563, 574, 564, 576, 577, 578, 579, 488, 489, 490, 491; 118/722, 723 MN, 723 MP, 723 ME, 723 MR, 723 MA, 723 AN, 723 E, 723 ER, 723 IR, 724, 501, 620, 641; 156/345, 643; 204/192.1, 192.32, 298.01, 298.02, 298.06, 298.16, 298.31, 298.37

[56] References Cited

U.S. PATENT DOCUMENTS

| | | | |
|---|---|---|---|
| H566 | 1/1989 | Ngaiesh et al. | 427/571 |
| 3,297,465 | 1/1967 | Connell et al. | 427/39 |
| 3,458,426 | 7/1969 | Rausch et al. | 204/298.06 |
| 3,472,679 | 10/1969 | Ing, Jr. | 427/38 |
| 3,762,941 | 10/1973 | Hou | 427/522 |
| 3,847,652 | 11/1974 | Fletcher et al. | 427/39 |
| 4,058,748 | 11/1977 | Sakudo et al. | 313/156 |
| 4,433,006 | 2/1984 | Cetronio | 427/39 |
| 4,559,100 | 12/1985 | Ninomiya et al. | 156/345 |
| 4,579,609 | 4/1986 | Reif et al. | 427/39 |
| 4,610,770 | 9/1986 | Saito et al. | 204/192.1 |
| 4,760,008 | 7/1988 | Yamazaki et al. | 427/39 |
| 4,762,756 | 8/1988 | Bergmann et al. | 427/39 |
| 4,808,554 | 2/1989 | Yamazaki | 427/39 |
| 4,885,070 | 12/1989 | Campbell et al. | 204/298.06 |
| 4,919,783 | 4/1990 | Asamaki et al. | 118/723 |
| 4,933,065 | 6/1990 | Seiler | 204/298.06 |
| 4,950,642 | 8/1990 | Okamoto et al. | 427/38 |
| 4,990,229 | 2/1991 | Campbell et al. | 118/723 IR |
| 5,022,977 | 6/1991 | Matsuoka et al. | 204/298.16 |
| 5,039,376 | 8/1991 | Zukotynski et al. | 427/39 |
| 5,045,166 | 9/1991 | Bobbio | 118/723 IR |
| 5,082,517 | 1/1992 | Moslehi | 118/723 IR |
| 5,091,049 | 2/1992 | Campbell et al. | 118/723 IR |
| 5,114,529 | 5/1992 | Masuyama et al. | 156/643 |
| 5,266,363 | 11/1993 | Yamazaki | 427/571 |
| 5,453,305 | 9/1995 | Lee | 427/562 |

FOREIGN PATENT DOCUMENTS

| | | | |
|---|---|---|---|
| 62-90924 | 4/1987 | Japan | H01L 21/205 |
| 1293521 | 11/1989 | Japan | 118/723 ER |
| 2277776 | 4/1990 | Japan | 118/723 IR |
| 3122099 | 5/1991 | Japan | 118/723 ER |
| 3264674 | 11/1991 | Japan | 118/723 IR |

Primary Examiner—Marianne Padgett
Attorney, Agent, or Firm—Fitzpatrick, Cella, Harper & Scinto

[57] ABSTRACT

A plasma processing apparatus for processing a base substance installed within a processing chamber into which predetermined gases are flowed and which is maintained at a predetermined pressure by producing a plasma within said processing chamber is characterized by comprising plasma producing means for producing the plasma within said processing chamber including at least two ground electrodes provided on external peripheries of said processing chamber, and an rf electrode provided on external periphery of said processing chamber between said two ground electrodes, and magnetic field producing means for producing a magnetic field orthogonal to an electric field formed by said plasma producing means.

22 Claims, 4 Drawing Sheets

APPARATUS AND METHOD FOR PROCESSING A BASE SUBSTANCE USING PLASMA AND A MAGNETIC FIELD

This application is a continuation of application Ser. No. 08/083,877, filed Jun. 30, 1993, which is a continuation of application Ser. No. 07/957,059, filed Oct. 6, 1992, now abandoned, which is a continuation of application Ser. No. 07/781,577, filed Oct. 23, 1991, now abandoned.

BACKGROUND OF THE INVENTION

1. Field of the Invention

The present invention relates to a plasma processing apparatus and its method for use in fabricating semiconductor devices or electronic circuits.

2. Related Background Art

In the fabrication process of semiconductor devices or electronic circuits, particularly, very large LSIs, the plasma processing apparatus holds an important position. For the formation of thin films such as SiN for the final protective film or NSG, PSG, BPSG for the layer insulation, a plasma CVD apparatus is used, while for the formation of Al thin films for the wiring, a sputtering apparatus is used. For the etching of various thin films, an RIE apparatus is used, while for the ashing of photo-resists, a plasma ashing apparatus is used. Other than these, the processes using plasma have been studied for the application to oxidation, nitriding, cleaning, doping and epitaxial processes. Most of the practical plasma processing apparatuses use a radio frequency of 13.56 MHz as the electrical energy source for the plasma processing by making the base substance in contact with the plasma having an electron density of about $1 \times 10^{10}/cm^2$ or more produced therefrom.

In the conventional plasma processing apparatus as described above, the base substance to be processed is placed in contact with the plasma, in which a sheath electric field is formed on the surface of the base substance in contact with the plasma. There is a drawback in that damage may easily occur on the surface of the base substance because ions in the plasma are accelerated due to this sheath electric field and enter the base substance with an energy of about several tens to hundreds eV.

To solve this drawback, a remote plasma processing apparatus having the plasma producing and processing chambers separated has been proposed, allowing for processing with less damage, as the plasma producing chamber and the base substance are spatially separated away from each other, neutral excitation species effective for the reaction may be easily deactivated due to collisions along the way of transport. Hence, there is a drawback of incomplete processing (having a low compactness of formed film), and the processing speed is slower.

SUMMARY OF THE INVENTION

It is an object of the present invention to provide a plasma processing apparatus and method which can solve the drawbacks associated with the conventional example as cited above, and process a base substance at a high speed with high accuracy and with less damage due to ions.

It is another object of the present invention to provide a plasma processing apparatus and method capable of controlling the plasma processing with excellent reliability.

It is a further object of the present invention to provide a plasma processing apparatus for processing a base substance installed within a processing chamber into which predetermined gases are flowed and which is maintained at a predetermined pressure by producing a plasma within the processing chamber, characterized by comprising:

a plasma producing means for producing the plasma within the processing chamber including at least two ground electrodes provided on external peripheries of the processing chamber, and an rf electrode provided on the external periphery of the processing chamber between the two ground electrodes, and a magnetic field producing means for producing a magnetic field orthogonal to an electric field formed by the plasma producing means.

It is a further object of the present invention to provide a plasma processing apparatus for processing a base substance installed within a processing chamber into which predetermined gases are flowed and which is maintained at a predetermined pressure by producing a plasma within the processing chamber, characterized by comprising:

a plasma producing means for producing the plasma within the processing chamber including at least two ground electrodes provided on external peripheries of the processing chamber, and an rf electrode provided on the external periphery of the processing chamber between the two ground electrodes, and a magnetic field producing means for producing a Mirror magnetic field orthogonal to an electric field formed by the plasma producing means.

It is a further object of the present invention to provide a plasma processing apparatus for processing a base substance installed within a processing chamber into which predetermined gases are flowed and which is maintained at a predetermined pressure by producing a plasma within the processing chamber, characterized by comprising:

plasma producing means for producing the plasma within the processing chamber including two ground electrodes provided on external peripheries of the processing chamber, and an rf electrode provided on the external periphery of the processing chamber between the two ground electrodes, and a magnetic field producing means for producing a magnetron magnetic field orthogonal to an electric field formed by the plasma producing means.

It is a further object of the present invention to provide a plasma processing method for processing a base substance installed within a processing chamber into which predetermined gases are flowed and which is maintained at a predetermined pressure by producing a plasma within the processing chamber, characterized by including, introducing the predetermined gases into the processing chamber of an apparatus, having plasma producing means for producing the plasma within the processing chamber including at least two ground electrodes provided on external peripheries of the processing chamber, and an rf electrode provided on the external periphery of the processing chamber between the two ground electrodes, and magnetic field producing means for producing a magnetic field orthogonal to an electric field formed by the plasma producing means, producing the plasma from the predetermined gases with the plasma producing means, and processing the base substance using the plasma.

It is a further object of the present invention to provide a plasma processing method for processing a base substance installed within a processing chamber into which predetermined gases are flowed and which is maintained at a predetermined pressure by producing a plasma within the processing chamber, characterized by including,

3 introducing the predetermined gases into the processing chamber of an apparatus, having plasma producing means for producing the plasma within the processing chamber including two ground electrodes provided on external peripheries of the processing chamber, and an rf electrode provided on the external periphery of the processing chamber between the two ground electrodes, and magnetic field producing means for producing a magnetron magnetic field orthogonal to an electric field formed by the plasma producing means, producing the plasma from the predetermined gases with the plasma producing means, and processing the base substance using the plasma.

DETAILED DESCRIPTION OF THE PREFERRED EMBODIMENTS

The preferred plasma processing apparatuses according to the present invention are as follows:

A plasma processing apparatus according to the present invention for processing a base substance installed within a processing chamber into which predetermined gases are flowed and which is maintained at a predetermined pressure by producing a plasma within the processing chamber is characterized by comprising:

a plasma producing means for producing the plasma within the processing chamber including at least two ground electrodes provided on the external peripheries of the processing chamber, and an rf electrode provided on external periphery of the processing chamber between the two ground electrodes; and a magnetic field producing means for producing a magnetic field orthogonal to an electric field formed by the plasma producing means.

Further, a plasma processing apparatus according to the present invention for processing a base substance installed within a processing chamber into which predetermined gases are flowed and which is maintained at a predetermined pressure by producing a plasma within the processing chamber is characterized by comprising:

a plasma producing means for producing the plasma within the processing chamber including at least two ground electrodes provided on external peripheries of the processing chamber, and an rf electrode provided the on external periphery of the processing chamber between the two ground electrodes; and a magnetic field producing means for producing a Mirror magnetic field orthogonal to an electric field formed by the plasma producing means.

Still further, a plasma processing apparatus according to the present invention for processing a base substance installed within a processing chamber into which predetermined gases are flowed and which is maintained at a

4 predetermined pressure by producing a plasma within the processing chamber is characterized by comprising:

a plasma producing means for producing the plasma within the processing chamber including at least two ground electrodes provided on external peripheries of the processing chamber, and an rf electrode provided on the external periphery of the processing chamber between the two ground electrodes; and a magnetic field producing means for producing a magnetron magnetic field orthogonal to an electric field formed by the plasma producing means.

On the other hand, the preferred plasma processing methods according to the present invention are as follows:

A plasma processing method according to the present invention for processing a base substance installed within a processing chamber into which predetermined gases are flowed and which is maintained at a predetermined pressure by producing a plasma within the processing chamber is characterized by including:

introducing the predetermined gases into the processing chamber of an apparatus, having plasma producing means for producing the plasma within the processing chamber including at least two ground electrodes provided on external peripheries of the processing chamber, and an rf electrode provided on the external periphery of the processing chamber between the two ground electrodes, and magnetic field producing means for producing a magnetic field orthogonal to an electric field formed by the plasma producing means, producing the plasma from the predetermined gases with the plasma producing means, and processing the base substance using the plasma.

Further, a plasma processing method according to the present invention for processing a base substance installed within a processing chamber into which predetermined gases are flowed and which is maintained at a predetermined pressure by producing a plasma within the processing chamber is characterized by including:

introducing the predetermined gases into the processing chamber of an apparatus, having plasma producing means for producing the plasma within the processing chamber including at least two ground electrodes provided on external peripheries of the processing chamber, and an rf electrode provided on the external periphery of the processing chamber between the two ground electrodes, and magnetic field producing means for producing a Mirror magnetic field orthogonal to an electric field formed by the plasma producing means, producing the plasma from the predetermined gases with the plasma producing means, and processing the base substance using the plasma.

Further, a plasma processing method according to the present invention for processing a base substance installed within a processing chamber into which predetermined gases are flowed and which is maintained at a predetermined pressure by producing a plasma within the processing chamber is characterized by steps of:

introducing the predetermined gases into the processing chamber of a plasma processing apparatus, the apparatus having plasma producing means for producing the plasma within the processing chamber including at least two ground electrodes provided on external peripheries of the processing chamber, and an rf electrode provided on the external periphery of the processing chamber between the two ground electrodes, and magnetic field producing means for producing a magnetron magnetic field orthogonal to an electric field formed by the plasma producing means, producing the plasma from the predetermined gases with the plasma producing means, and processing the base substance using the plasma.

With a plasma processing apparatus and method according to the present invention, it is possible to make different damages arising on a surface of the base substance or different processing speeds in accordance with an installed position of the base substance by localizing the plasma with a magnetic field, which is orthogonal to an rf electric field which is formed by the plasma producing means being produced by magnetic field producing means, thereby accurately controlling them.

When a processed base substance is installed at a low plasma density and in the neighborhood of plasma producing means, the energy and number of ions incident upon the base substance will decrease, with neutral excitation species effective for the reaction being transported in a large quantity into the neighborhood of the base substance, so that high accuracy and high speed processing can be performed.

With a plasma processing apparatus according to the present invention, the base substance may be installed in the neighborhood of the plasma producing means, and at a position with a low plasma density of the plasma produced by the plasma producing means.

Furthermore, light source means may be provided for emitting the light having a wavelength absorbable into the base substance or gas molecules sticking to the base substance and reaction intermediates toward the base substance.

With a plasma processing apparatus according to the present invention, because ground electrodes are provided on both adjacent sides of an rf electrode, the rf electric field is localized between each electrode, with little leakage into other portions. Since each electrode is formed as a ring wound around an external periphery of the processing chamber, and owing to a magnetic field orthogonal to the rf electric field which is applied with magnetic field producing means, the plasma can be confined in the neighborhood of electrodes in accordance with a drift mobility, which is determined by the rf electric field and the magnetic field.

Here, as the magnetic field orthogonal to the rf electric field, a Mirror magnetic field or magnetron magnetic field can be cited, for example.

With the plasma processing apparatus according to the present invention, as the electric field in the neighborhood of the rf electrode is directed perpendicularly to an electrode face before and after discharge, electrons accelerated by a sheath electric field travel in cycloidal movement in a peripheral direction along the electrode face by the magnetic field applied perpendicularly to their travelling direction at all times by producing an electric field perpendicular to the rf electric field, so that the plasma will be confined like a ring in the neighborhood of the rf electrode. Thus, by providing different installing positions of the base substance, damages arising on a surface of the base substance or the processing speed may be rendered different.

When the base substance is installed in the neighborhood of the plasma producing means and at a position having a low plasma density of the plasma produced by the plasma producing means, high accuracy and high speed processing is allowed. This is based on the fact that the number of ions that may cause damage on the base substance is proportional to the plasma density in the neighborhood of the base substance.

If the base substance is installed in a space, which is a little away from the electrode but having a low plasma density (e.g., less than $5\times10^8/cm^3$), the number of ions will be fewer by one or more digits than that of a conventional plasma processing apparatus (Ne>$1\times10^{10}/cm^3$). Also, if the plasma density is decreased to $5\times10^8/cm^3$ or less under the ordinary plasma service conditions (pressure: 10 to 300 Torr, electron temperature: 2 to 7 eV), the sheath thickness becomes larger and causes collisions between ions and molecules in a sheath, so that the energy of ions accelerated by the sheath electric field will be mitigated. Therefore, the number and energy of ions incident upon the base substance may decrease, resulting in reduced damages arising in the base substance and closer distances to the electrodes, neutral excitation species effective with the reaction will be supplied by a larger amount to the base substance, so that a highly accurate processing is allowed.

When a Mirror magnetic field is used as the magnetic field orthogonal to the electric field formed by the plasma producing means, the efficient control of the plasma producing region can be easily made, with an excellent processing accuracy as the apparatus.

Also, when a magnetron magnetic field is used as the magnetic field orthogonal to the electric field formed by the plasma producing means, the reliability of the apparatus is superior.

The preferred examples of the present invention will be described below with reference to the drawings.

[EXAMPLE]

Figure 1:
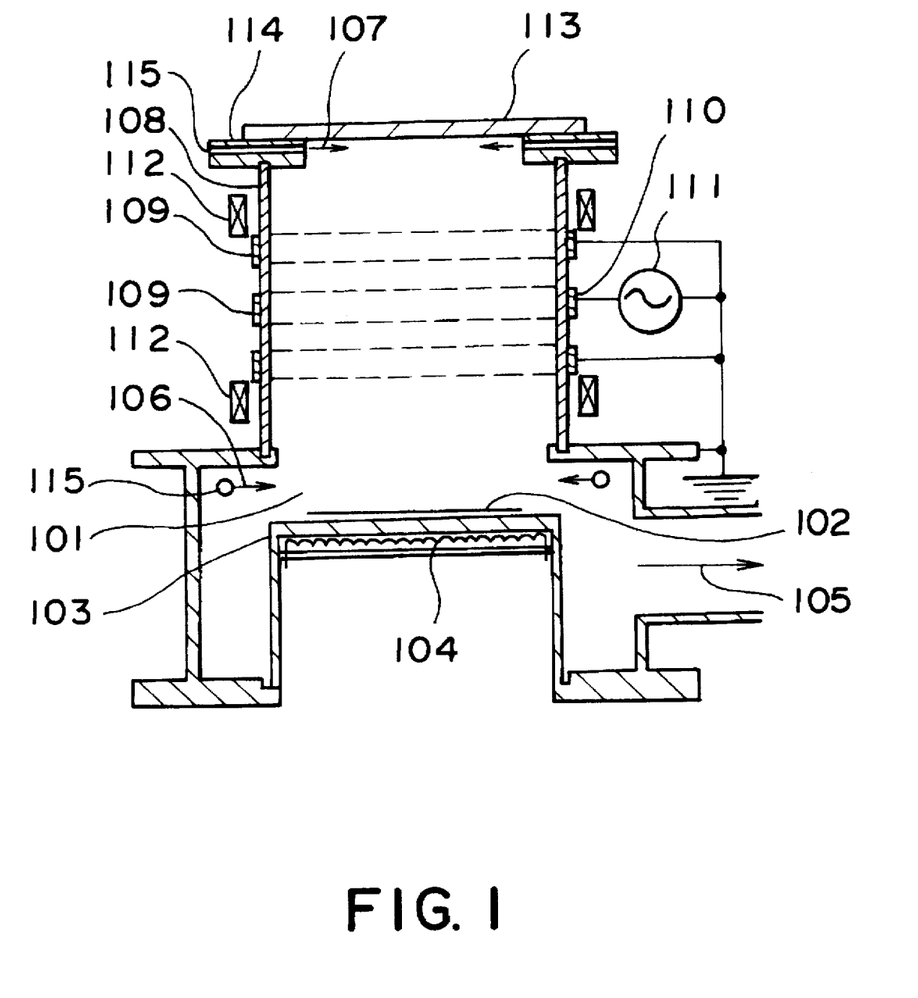
FIG. 1 is a typical view showing one example of a plasma processing apparatus according to the present invention.

FIG. 1 is a typical view showing one example of a plasma processing apparatus according to the present invention.

This example is a plasma CVD apparatus as constituted by using a structure of the present invention.

In the figure, 101 is a reaction chamber, 102 is a base substance to be processed such as a Si substrate, 103 is a support for carrying the base substance 102 to be processed, 104 is a heater for heating the base substance 102 to be processed, 105 is an exhaust system, 106 is a first source gas, 107 is a second source gas, 108 is a quartz tube, 109 is a ground electrode, 110 is an rf electrode, 111 is an rf generator, 112 is an electromagnet for producing a Mirror magnetic field perpendicular to the electric field in the neighborhood of the rf electrode, 113 is a window, 114 is a window support, and 115 is a source gas inlet port.

The cylindrical quartz tube 108 is laid on the support 103, around external peripheries of which are wound the ground electrode 109 which is plasma producing means, the rf electrode 110 having an electric power supplied from the rf generator 111 and the ground electrode 109, in sequence from the top, the portion corresponding to these electrodes being a main plasma producing region. Also, two electromagnets are provided 112, 112 which are magnetic field producing means for producing the Mirror magnetic field perpendicular to an external peripheral surface of the quartz tube 108, around the peripheries of the quartz tube 108 and in upper and lower portions of the electrodes. An interior in the vicinity of the connection between the quartz tube 108 and the support 103 serves as the reaction chamber 101, the base substance 102 being laid on the support 103 at a lower portion of the reaction chamber 101 by a support member, not shown. The heater 104 heats the base substance 102 via the support 103, and is provided on an under side of the support 103 where the base substance 102 is laid. An upper portion of the quartz tube 108 is enclosed by the window 113 formed of quartz with the window support 114 placed therebetween. This window support 114 is provided with the port 115 through which the second source gas 107 is entered. Also, the support 103 is provided with the port 115 through which the first source gas is entered.

Next, the operation in forming the film by the use of the present invention will be described below.

The user first places the base substance 102 on the support 103, and passes the electric current to the heater 104 to heat the base substance 102 from room temperature up to a desired temperature of several hundred degrees. Then the first source gas 106 to be directly introduced into the neighborhood of the base substance 102 and the second source gas 107 to be introduced through the plasma producing region are entered, and held at a desired pressure between 0.001 to 1 Torr with a conductance valve (not shown) provided on the side of the exhaust system 105. Further, under the existence of Mirror magnetic field of several hundreds gausses with the electromagnets 112, 112, the plasma localized between the rf electrode 110 and two ground electrodes 109, 109 is produced by supplying a radio frequency of several tens to several kW produced on the rf electrode 110 by the rf generator 111, in order to form the film until a desired film thickness can be obtained.

With this method, the first source gas 106 and the second source gas 107 react on a surface of the base substance 102, so that it is possible to form an insulator layer such as SiN, $SiO_2$, $Ta_2O_5$, $Al_2O_3$, AlN, a semiconductor layer such as a-Si, Poly-Si, C-Si, GaAs, and a metal layer such as Al, W.

[Example 1]

A specific example in forming the SiN film for protection of LSI will be described using this apparatus.

An Si substrate was used as the base substance 102, on which an 8000 Å thick $SiO_2$ film, and then a 7000 Å thick Al pattern was formed. After heating the base substance 102 at 300° C., $SiH_4$ as the first source gas 106 and $N_2$ as the second source gas 107 are flowed in 20 sccm and 200 sccm, respectively, with the pressure held at 0.2 Torr. The radio frequency from the rf generator 111 is supplied to the rf electrode 110 by the amount of 200 W to form the film for 11 minutes. As a result, a film having a density of 2.8 g/cm³, a hydrogen content ratio of 12 atm %, a stress of $2 \times 10^9$ dyn/cm² (compression) in a good quality and with less damages was obtained with a film thickness of 6000 Å. This film could be superior to one having a density of 2.4 g/cm³ a hydrogen content ratio of 20 atm % and a stress of $4 \times 10^9$ dyn/cm² (compression), as obtained with a conventional plasma CVD apparatus under the conditions of a temperature of 300° C., $SiH_4$ of 20 sccm, $N_2$ of 200 sccm, a pressure of 0.2 Torr and an rf power of 200 W, and resulted in less damages.

Here, it is noted that:
i) The density was calculated from a lorentz-to-lorentz formula with a refractive index of the ellipsometry and a composition ratio of the Auger spectroscopy.
ii) The hydrogen content ratio was obtained by dividing the absorbancy of Si-H and N-H band in infrared absorption spectrum by absorption coefficient.
iii) The stress was obtained from the change of warp of base substance before and after the film formation, which was measured with an interferometer.

[Example 2]

An instance where the apparatus is shown in FIG. 1 is applied to a surface reformer will be described below.

In this case, the user installs the base substance 102 on the support 103, and passes the electric current to the heater 104 to heat the base substance 102 from the room temperature up to a desired temperature of several hundred degrees. Then the first and second source gases 106, 107 useful for the processing are introduced, and held at a desired pressure between 0.001 to 1 Torr with a conductance valve (not shown) provided on the side of the exhaust system 105. Further, under the existence of a Mirror magnetic field of several hundreds gausses with the electromagnets 112, 112, the plasma localized between the rf electrode 110 and two ground electrodes 109, 109 is produced by supplying a radio frequency of several tens to several kW produced on the rf electrode 110 by the rf generator 111, in order to perform the processing.

With this method, the oxidation and nitriding of Si, Al, Ti, Zn, Ta, etc. are allowed and the doping of B, As, P, etc. is allowed.

[Example 3]

Next, an example of oxidizing Si for LSI gate will be described using the apparatus as shown in FIG. 1. An Si substrate was used as the base substance 102. After heating the base substance 102 at 500° C., $O_2$ as the first and second source gases 106, 107 useful for the oxidation was flowed in 200 sccm, with the pressure held at 0.2 Torr. The radio frequency from the rf generator 111 was supplied to the rf electrode 110 by the amount of 500 W, and the oxidation was made for 100 minutes. As a result, an excellent 600 Å thick film with a density of 2.1 g/cm³ and a withstand pressure of 11 MV/cm, Qss/q, $4 \times 10^{10}$/cm² was formed. This film was superior to that formed with a conventional plasma oxidizing apparatus, having a density of 1.8 g/cm³ and a withstand pressure of 9 MV/cm, Qss/q, $1 \times 10^{12}$ dyn/cm².

[Example 4]

An instance where the apparatus as shown in FIG. 1 is applied to a cleaning apparatus will be described below.

First, the user installs the base substance 102 on the support 103, and passes the electric current to the heater 104 to heat the base substance 102 from room temperature up to a desired temperature of several hundred degrees. Then the first and second source gases 106, 107, which are useful for the cleaning are allowed to flow and are held at a desired pressure between 0.001 to 1 Torr with a conductance valve (not shown) provided on the side of the exhaust system 105. Further, under the existence of a Mirror magnetic field of several hundreds gausses with the electromagnets 112, 112, the plasma localized between the rf electrode 110 and two ground electrodes 109, 109 is produced by supplying a radio frequency of several tens to several kW produced on the rf electrode 110 by the rf generator 111, in order to perform the cleaning.

[Example 5]

Next, an example of cleaning Si substrate will be described using the apparatus as shown in FIG. 1. An Si substrate was used as the base substance 102. After heating the base substance 102 at 300° C., $NF_3$ as the first and second source gases 106, 107, which is useful for the cleaning, was flowed in 200 sccm, with the pressure held at 0.1 Torr. The radio frequency from the rf generator 111 was supplied to the rf electrode 110 by the amount of 200 W for 8 minutes. Afterwards, a 900 Å A thick $SiO_2$ film was formed with the photo assisted CVD, and the measurement of surface characteristics (Qss/q) indicated an excellent value of $3 \times 10^{10}$/cm².

It could be found that the film of this example was superior to that formed with a conventional plasma cleaning apparatus, having Qss/q, about $5 \times 10^{11}$ dyn/cm².

Note that the magnetic field in the neighborhood of two ground electrodes 109, 109 in this example as shown in FIG. 1 is useful for suppressing the production of plasma, and should be in parallel to a face containing the ground electrodes. The frequency used here can be normally an appropriate value selected from the range of 1 to 300 MHz. The magnetic flux density in the neighborhood of the rf electrode can be an appropriate value selected from the range of 100 to 1 kG in accordance with a required degree of plasma confinement. The electromagnet used as magnetic field producing means may be a permanent magnet.

[Example 6]

Figure 2:
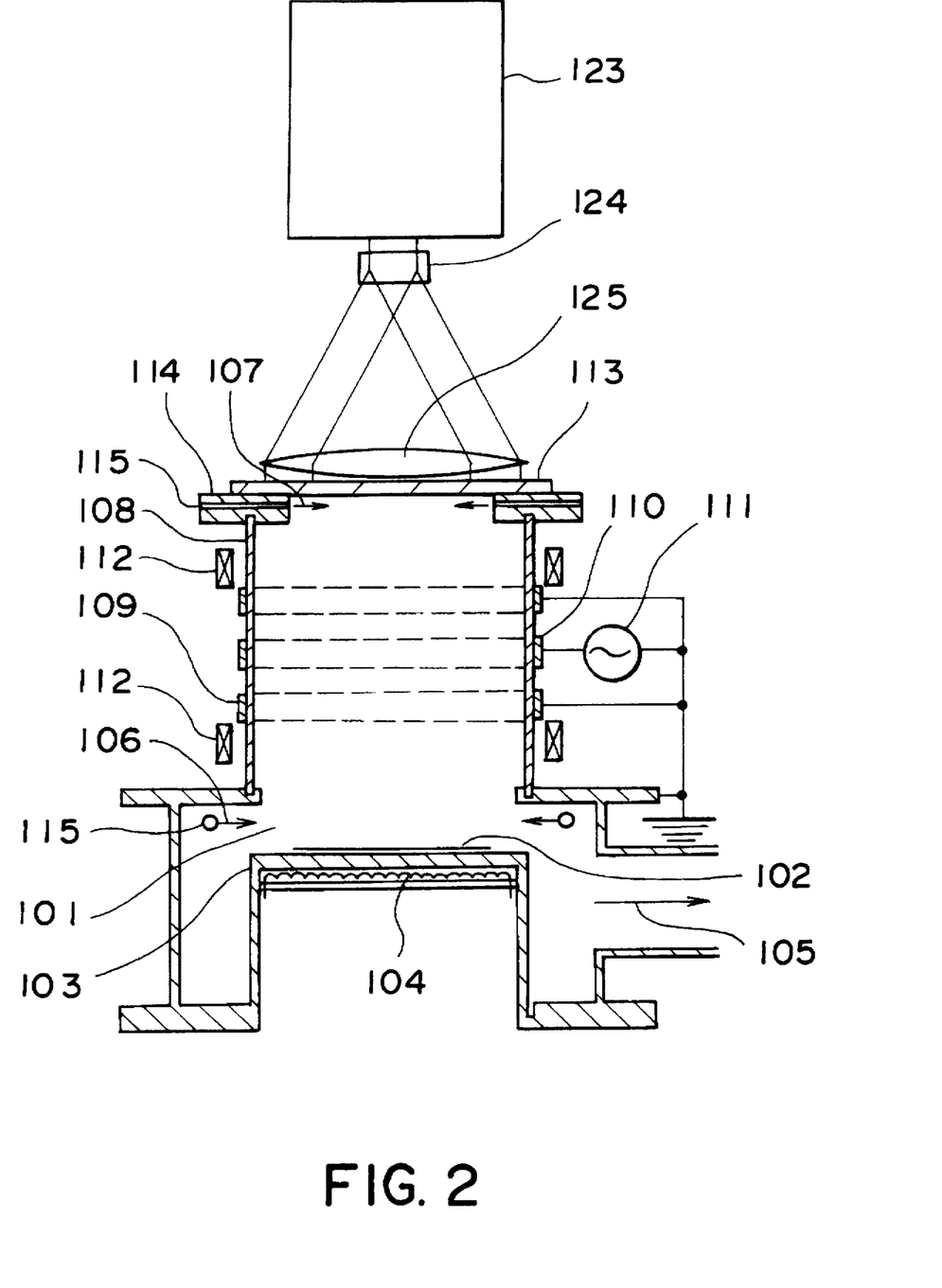
FIG. 2 is a typical view showing another example of a plasma processing apparatus according to the present invention.

FIG. 2 is a typical view showing another example of a plasma processing apparatus according to the present invention.

This example is an optical assisted plasma CVD apparatus as disclosed in Japanese Patent Application Laid-Open No. 62-90924 which was constituted using the first apparatus as shown in FIG. 1.

In FIG. 2, 123 is a lamp for emitting the light with a wavelength absorbable into gas molecules sticking to the base substance 102 or reaction intermediates, 124 is an integrator such as a fly array lens provided for mixing the light from the lamp 123, and 125 is a collimator lens in which the transmitted light from the integrator 124 is entered and the light flux rendered parallel is emitted. The other constitution is the same as in FIG. 1, and indicated by the same numerals, and the explanation will be omitted.

The operation in forming the film using this apparatus will be described.

The user first installs the base substance 102 on the support 103, and then causes the heater 104 to heat the base substance 102 from room temperature up to a desired temperature of several hundred degrees, while applying the light from the lamp through the window 113 onto the coated base substance 102. Then the first source gas 106 directly introduced into the neighborhood of the base substance 102 and the second source gases 107 introduced through the plasma producing region are entered, and held at a desired pressure between 0.001 to 1 Torr with a conductance valve (not shown) provided on the side of the exhaust system 105. Further, under the existence of a Mirror magnetic field of several hundred gausses with the electromagnets 112, 112, the plasma localized between the rf electrode 110 and two ground electrodes 109, 109 is produced by supplying a radio frequency of several tens to several kW produced on the rf electrode 110 by the rf generator 111, in order to form the film until a desired film thickness can be obtained.

With this method, by changing source gas, the formation of film for insulator such as SiN, SiO$_2$, Ta$_2$O$_5$, Al$_2$O$_3$, AlN, semiconductor such as a-Si, Poly-Si, C-Si, GaAs, and metal such as Al, W can be made.

A specific example of forming the SiN film for protection of LSI will be described using the apparatus as shown in FIG. 2.

An Si substrate was used as the base substance 102, on which a 8000 Å thick SiO$_2$ film, and then a 7000 Å thick Al pattern were formed. A xenon lamp was used as the lamp 123. The light from the lamp 123 was applied at an intensity of about 0.6 W/cm$^2$ onto the base substance 102. With this application of light, the temperature of the base substance 102 was raised up to 300° C. SiH$_4$ as the first source gas 106 and N$_2$ as the second source gas 107 are flowed in 20 sccm and 200 sccm, respectively, with the pressure held at 0.05 Torr. Subsequently, the rf electric power from the rf generator 111 is supplied to the rf electrode 110 by the amount of 200 W to form the film for 15 minutes.

As a result, a film having a density of 3.1 g/cm$^3$, a hydrogen content ratio of 5 atm % and a stress of 2×10$^9$ dyn/cm$^2$ tension in a good quality and with less damages was obtained in a thickness of 7300 Å. It could be found one this film was superior to that as formed with a conventional plasma CVD apparatus, having a density of 2.4 g/cm$^3$, a hydrogen content ratio of 20 atm % and a stress of about 4×10$^9$ dyn/cm$^2$ (compression) and causing many damages.

[Example 7]

Figure 3:
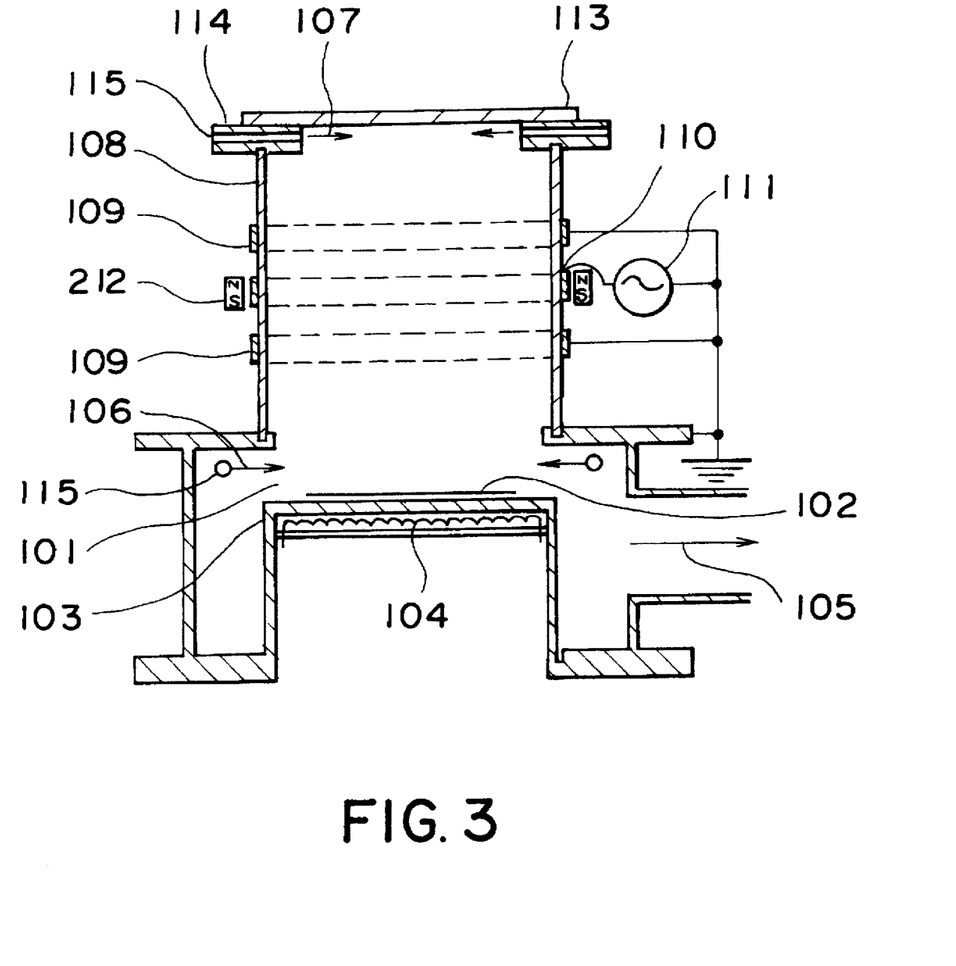
FIG. 3 is a typical view showing a further example of a plasma processing apparatus according to the present invention.

FIG. 3 is a typical view showing another example of a plasma processing apparatus according to the present invention.

The plasma processing apparatus of FIG. 3, which constitutes a plasma CVD apparatus, is different from that of FIG. 1 in that the apparatus of FIG. 1 is provided with two electromagnets 112, 112 as means for producing a Mirror magnetic field perpendicular to external peripheries of a quartz tube, while the apparatus of FIG. 3 is provided with a magnet 212 as magnetic field producing means for producing a magnetron magnetic field perpendicular to external peripheries of the quartz tube. The other constitution is the same as in FIG. 1, and the explanation will be omitted.

The operation in forming the film using the apparatus as shown in FIG. 3 will be described.

The user first installs the base substance 102 to be processed on the support 103, and then passes the electric current to the heater to heat the base substance 102 from room temperature up to a desired temperature of several hundred degrees. Then the first source gas 106 is directly introduced into the vicinity of the base substance 102 and the second source gases 107 is introduced through the plasma producing region, and the gases 106 and 107 are held at a desired pressure between 0.001 to 1 Torr with a conductance valve (not shown) provided on the side of the exhaust system 105. Further, under the existence of a magnetron magnetic field of several hundreds gausses with the magnet 212, the plasma localized between the rf electrode 110 and two ground electrodes 109, 109 is produced by supplying a radio frequency of several tens to several kW produced on the rf electrode 110 by the rf generator 111, in order to form the film until a desired film thickness can be obtained.

With this method, it is possible to form the film of insulator such as SiN, SiO$_2$, Ta$_2$O$_5$, Al$_2$O$_3$, AlN, semiconductor such as a-Si, Poly-Si, C-Si, GaAs, and metal such as Al, W, because the first source gas 106 and the second source gas 107 react on the base substance 102.

[Example 8]

A specific example of forming the SiN film for protection of LSI will be described using the apparatus as shown in FIG. 3.

An Si substrate was used as the base substance 102, on which a 8000 Å thick SiO$_2$ film, and then a 7000 Å thick Al pattern were formed. Subsequently, after heating the base substance 102 at 300° C., SiH$_4$ as the first source gas 106 and N$_2$ as the second source gas 107 are flowed in 20 sccm and 200 sccm, respectively, with the pressure held at 0.2 Torr. The radio frequency from the rf generator 111 is supplied to the rf electrode 110 by the amount of 200 W to form the film for 11 minutes. As a result, a film having a density of 2.8 g/cm$^3$, a hydrogen content ratio of 12 atm % and a stress of 2×10$^9$ dyn/cm$^2$ (compression) in a good quality and with less damages was obtained in a thickness of 6000 Å. This film was superior to that as formed with a conventional plasma CVD apparatus, under the conditions of a temperature of 300° C., $SiH_4$ $20/N_2$ 200 sccm, a pressure of 0.2 Torr, and an rf power of 200 W, having a density of 2.4 g/cm$^3$, a hydrogen content ratio of 20 atm % and a stress of $4\times10^9$ dyn/cm$^2$ (compression), and had less damages. Here, the density, the hydrogen content ratio and the stress were the same as previously described.

[Example 9]

An instance where the apparatus as shown in FIG. 3 is applied to a surface reformer will be described below.

In this case, the user installs the base substance 102 on the support 103, and passes the electric current to the heater 104 to heat the base substance 102 from room temperature up to a desired temperature of several hundred degrees. Then the first and second source gases 106, 107, which are useful for the processing, are cause to flow and held at a desired pressure between 0.001 to 1 Torr with a conductance valve (not shown) provided on the side of the exhaust system 105. Further, under the existence of a magnetron magnetic field of several hundreds gausses with the magnet 212, the plasma localized between the rf electrode 110 and two ground electrodes 109, 109 is produced by supplying a radio frequency of several tens to several kW produced on the rf electrode 110 by the rf generator 111, in order to perform the processing.

With this method, the oxidation and nitriding of Si, Al, Ti, Zn, Ta, etc. are allowed and the doping of B, As, P, etc. is allowed.

[Example 10]

Next, an example of oxidizing Si for LSI gate will be described using the apparatus as shown in FIG. 3. An Si substrate was used as the base substance 102. After heating the base substance 102 at 500° C., $O_2$ as the first and second source gases 106, 107 useful for the oxidation were flowed in 200 sccm, with the pressure held at 0.2 Torr. The radio frequency from the rf generator 111 was supplied to the rf electrode 110 by the amount of 500 W, and the oxidation was done for 100 minutes. As a result, a good film having a density of 2.1 g/cm$^3$ and a withstand pressure of 11 MV/cm, Qss/q, $4\times10^{10}$/cm$^2$ was formed in a thickness of 600 Å. This film was superior to that formed with a conventional plasma oxidizing apparatus, having a density of 1.8 g/cm$^3$ and a withstand pressure of 9 MV/cm, Qss/q, about $1\times10^{12}$ dyn/cm$^2$.

[Example 11]

An instance where the apparatus as shown in FIG. 3 is applied to a cleaning apparatus will be described below.

First, the user installs the base substance 102 on the support 103, and passes the electric current to the heater 104 to heat the base substance 102 from room temperature up to a desired temperature of several hundred degrees. Then the first and second source gases 106, 107, which are useful for the cleaning, are caused to flow and held at a desired pressure between 0.001 to 1 Torr with a conductance valve (not shown) provided on the exhaust system 105 side. Further, under the existence of a magnetron magnetic field of several hundreds gausses with the magnet 212, the plasma localized between the rf electrode 110 and two ground electrodes 109, 109 is produced by supplying a radio frequency of several tens to several kW produced on the rf electrode 110 by the rf generator 111, in order to perform the cleaning.

[Example 12]

Next, an example of cleaning an Si substrate will be described using the apparatus as shown in FIG. 3. An Si substrate was used as the base substance 102. After heating the base substance 102 at 300° C., $NF_3$ as the first and second source gases 106, 107 useful for the cleaning was flowed in 200 sccm, with the pressure held at 0.1 Torr. The radio frequency from the rf generator 111 was supplied to the rf electrode 110 by the amount of 200 W for 8 minutes. Afterwards, a 900 Å thick $SiO_2$ film was formed with the photo assisted CVD, and the measurement of surface characteristics (Qss/q) indicated an excellent value of $3\times10^{10}$/cm$^2$.

It could be found that the film of this example was superior to that formed with a conventional plasma cleaning apparatus, having Qss/q, about $5\times10^{11}$ dyn/cm$^2$.

Note that the magnetic field in the neighborhood of two ground electrodes 109, 109 in the apparatus as shown in FIG. 3 is useful for suppressing the production of plasma, and should be in parallel to a face containing the ground electrodes. The frequency used here can be normally an appropriate value selected from the range of 1 to 300 MHz. The magnetic flux density in the neighborhood of the rf electrode can be an appropriate value selected from the range of 100 to 1 kG in accordance with a required degree of plasma confinement. The magnet (permanent magnet) for use as magnetic field producing means may be an electromagnet.

[Example 14]

Figure 4:
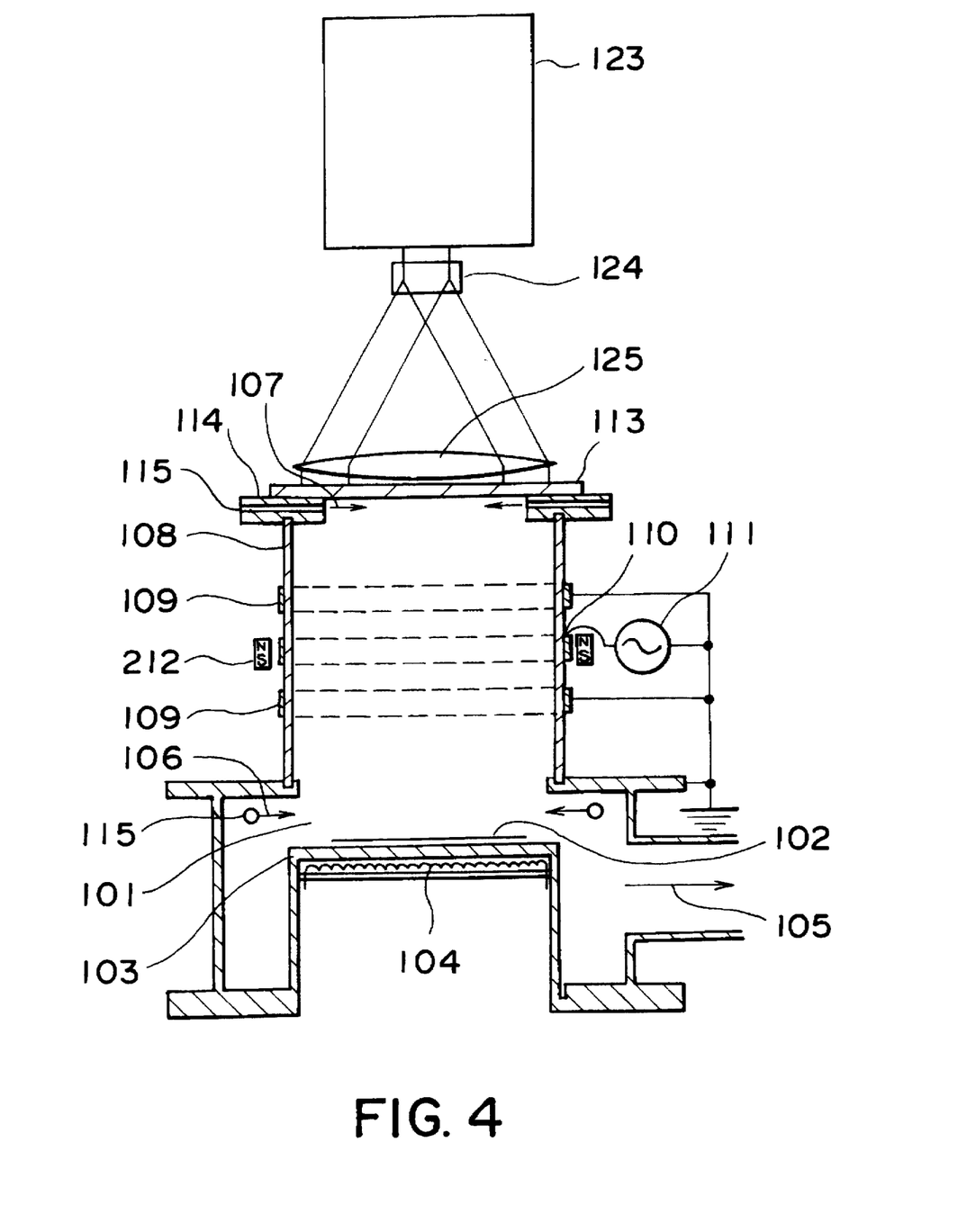
FIG. 4 is a typical view showing a further example of a plasma processing apparatus according to the present invention.

FIG. 4 is a typical view showing another example of a plasma processing apparatus according to the present invention.

The apparatus of FIG. 4 is an optical assisted plasma CVD apparatus as disclosed in Japanese Laid-open Patent Application No. 62-90924 which was constituted using the apparatus as shown in FIG. 3, like the apparatus as shown in FIG. 2.

The apparatus of FIG. 4 is provided with the magnet 212 as the magnetron magnetic field producing means, while the apparatus of FIG. 2 is provided with two electromagnets 112 as the Miller magnetic field producing means.

In FIG. 4, 123 is a lamp for emitting the light with a wavelength absorbable into gas molecules sticking to the base substance 102 or reaction intermediate, 124 is an integrator such as fly array lens provided for mixing the light from the lamp 123, and 125 is a collimator lens in which the transmitted light from the integrator 124 is entered and the light flux rendered parallel is emitted. The other constitution is the same as in FIG. 3, and indicated by the same numerals, and the explanation will be omitted.

The operation in forming the film using this apparatus will be described.

The user first installs the base substance 102 on the support 103, and then causes the heater to heat the base substance 102 from room temperature up to a desired temperature of several hundred degrees, while applying the light from the lamp 123 through the window 113 onto the base substance 102. Then the first source gas 106 directly introduced into the neighborhood of the base substance 102 and the second source gases 107 introduced through the plasma producing region are entered, and held at a desired pressure between 0.001 to 1 Torr with a conductance valve (not shown) provided on the side of the exhaust system 105. Further, under the existence of a magnetron magnetic field of several hundred gausses with the electromagnet 212, the plasma localized between the rf electrode 110 and two ground electrodes 109, 109 is produced by supplying a ratio frequency of several tens to several kW produced on the rf electrode 110 by the rf generator 111, in order to form the film until a desired film thickness can be obtained.

With this method, by changing source gas, the formation of film of insulator such as SiN, $SiO_2$, $Ta_2O_5$, $Al_2O_3$, AlN, semiconductor such as a-Si, Poly-Si, C-Si, GaAs, and metal such as Al, W can be made.

A specific example of forming the SiN film for protection of LSI will be described using the apparatus as shown in FIG. 4.

An Si substrate coated with a 8000 Å thick $SiO_2$ film, and then formed with a 7000 Å thick Al pattern thereon was used as the coated base substance 102. A xenon lamp was used as the lamp 123. The light from the lamp 123 was applied at an intensity of about 0.6 W/cm² onto the base substance 102. With this application of light, the temperature of the base substance 102 was raised up to 300° C. $SiH_4$ as the first source gas 106 and $N_2$ as the second source gas 107 are flowed in 20 sccm and 200 sccm, respectively, with the pressure held at 0.05 Torr. Subsequently, the rf electric power from the rf generator 111 is supplied to the rf electrode 110 by the amount of 200 W to form the film for 15 minutes.

As a result, a film having a density of 3.1 g/cm³, a hydrogen content ratio of 5 atm % and a stress of $2\times10^9$ dyn/cm² tension in a good quality and with less damages was obtained in a thickness of 7300 Å. It could be found that this film was superior to that as formed with a conventional plasma CVD apparatus, having a density of 2.4 g/cm³, a hydrogen content ratio of 20 atm % and a stress of about $4\times10^9$ dyn/cm² (compression) and with many damages.

What is claimed is:

1. A plasma processing apparatus for processing a base substance installed within a processing chamber into which a gas for use in a plasma process is introduced and maintained at a pressure of 0.001 to 1 Torr, comprising:

plasma producing means for producing a plasma within said processing chamber including two ground electrodes and one rf electrode provided on an external periphery surrounding said processing chamber, said rf electrode being disposed between said two ground electrodes;

magnetic field producing means comprising a first and a second magnet for producing a mirror magnetic field orthogonal to an rf electric field between said ground electrodes which is formed by said plasma producing means, wherein said first and second magnets are arranged on the external periphery surrounding said chamber so as to sandwich said two ground and one rf electrodes, thereby confining plasma produced by said plasma producing means substantially within a plasma generating space within the vicinity of said electrodes as determined by said rf electric field and said magnetic field; and supporting means for supporting said base substance, wherein said supporting means supports said base substance at a sufficient distance from said plasma generating space to be in a region of lower plasma density than said plasma generating space.

2. The plasma producing apparatus according to claim 1, further comprising light source means for emitting light having a wavelength absorbable into said base substance or gas molecules sticking to said base substance or reaction intermediates onto said covered base substance.

3. An apparatus according to claim 1, wherein said magnets comprise electromagnets.

4. An apparatus according to claim 1, wherein said magnets comprise permanent magnets.

5. A plasma processing apparatus for processing a base substance installed within a processing chamber into which a gas for use in plasma processing is introduced and maintained at a pressure between 0.001 and 1 Torr, comprising:

plasma producing means for producing a plasma within said processing chamber two ground electrodes and one rf electrode provided on an external periphery surrounding said processing chamber, said rf electrode being disposed between said two ground electrodes; and magnetic field producing means provided along an external periphery of said rf electrode for producing a magnetron magnetic field orthogonal to an electric field formed by said plasma producing means.

6. The plasma producing apparatus according to claim 5, further comprising light source means for emitting a light having a wavelength absorbable into said base substance or gas molecules sticking to said base substance or reaction intermediates onto said covered base substance.

7. An apparatus according to claim 5, wherein said magnets comprise electromagnets.

8. An apparatus according to claim 5, wherein said magnets comprise permanent magnets.

9. A plasma processing method for processing a base substance installed within a processing chamber of an apparatus into which a gas for use in plasma processing is introduced and maintained at a pressure between 0.001 and 1 Torr, comprising:

introducing said gas into said processing chamber, having (I) plasma producing means for producing a plasma within the processing chamber including two ground electrodes and one rf electrode provided on an external periphery surrounding said processing chamber, said rf electrode being disposed between said two ground electrodes, and (ii) magnetic field producing means comprising a first and a second magnet arranged on an external periphery surrounding said chamber so as to sandwich said two ground and one rf electrodes, for producing a mirror magnetic field orthogonal to an rf electric field which is formed by said plasma producing means;

producing the plasma from said gas substantially within a plasma generating space inside said processing chamber with said plasma producing means;

processing said base substance using said plasma; and wherein said base substance is disposed at a sufficient distance from said plasma generating space to be in a region of lower plasma density than said plasma generating space.

10. The plasma processing method according to claim 9, further comprising forming a thin film on said base substance.

11. The plasma processing method according to claim 9, further comprising reforming a surface of said base substance.

12. The plasma processing method according to claim 9, further comprising removing a surface of said base substance or extraneous matters on the surface of said base substance.

13. A method according to claim 9, wherein said magnets comprise electromagnets.

14. A method according to claim 7, wherein said magnets comprise permanent magnets.

15. A method according to claim 9, wherein said base substance is at least arranged adjacent to said plasma processing means within said processing chamber, and is subjected to processing in a low plasma density region less than or equal to $5 \times 10^8/\text{cm}^3$.

16. A plasma processing method for processing a base substance installed within a processing chamber of an apparatus into which a gas for use in plasma processing is introduced and maintained at a pressure between 0.001 and 1 Torr, comprising:

introducing said gas into said processing chamber, having (I) plasma producing means for producing plasma within the processing chamber including two ground electrodes and one rf electrode provided on an external periphery surrounding said processing chamber, said rf electrode being disposed between said two ground electrodes, and (ii) magnetic field producing means, arranged along an external periphery of said rf electrode, for producing a magnetron magnetic field orthogonal to an electric field formed by said plasma producing means;

producing the plasma from said gas substantially within a plasma generating space inside said processing chamber with said plasma producing means; and processing said base substance using said plasma, wherein said base substance is disposed at a sufficient distance from said plasma generating space to be in a region of lower plasma density than said plasma generating space.

17. The plasma processing method according to claim 16, further comprising forming a thin film on said base substance.

18. The plasma processing method according to claim 16, further comprising removing a surface of said base substance.

19. The plasma processing method according to claim 16, further comprising removing a surface of said based substance or extraneous matters on the surface of said base substance.

20. A method according to claim 16, wherein said magnets comprise electromagnets.

21. A method according to claim 16, wherein said magnets comprise permanent magnets.

22. A method according to claim 16, wherein said base substance is at least arranged adjacent to said plasma processing means within said processing chamber, and is subjected to processing in a low plasma density region less than or equal to $5 \times 10^8/\text{cm}^3$.

* * * * *

UNITED STATES PATENT AND TRADEMARK OFFICE
CERTIFICATE OF CORRECTION

PATENT NO. : 5,707,692

DATED : June 15, 1998

INVENTOR(S): NOBUMASA SUZUKI

It is certified that error appears in the above-identified patent and that said Letters Patent is hereby corrected as shown below:

ON THE COVER PAGE:

At "References Cited, item [56]

"1293521  11/1989  Japan
 2277776  4/1990   Japan
 3122099  5/1991   Japan
 3264674  11/1991  Japan" should read
--1-293521 11/1989 Japan
  2-277776 4/1990  Japan
  3-122099 5/1991  Japan
  3-264674 11/1991 Japan--

COLUMN 2:

Line 35, "plasma" (1st occurrence) should read --a plasma--;

UNITED STATES PATENT AND TRADEMARK OFFICE
CERTIFICATE OF CORRECTION

PATENT NO. : 5,707,692

DATED : June 15, 1998

INVENTOR(S): NOBUMASA SUZUKI

It is certified that error appears in the above-identified patent and that said Letters Patent is hereby corrected as shown below:

COLUMN 3:

Line 42, "on" should read --on the--; and
Line 57, "the on" should read --on the--.

COLUMN 4:

Line 56, "by" should read --by the--.

COLUMN 5:

Line 65, "having" should read --has--.

COLUMN 7:

Line 14, "hundreds" should read --hundred--;
Line 62, "is shown" should read --as shown--; and
Line 66, "from the" should read --from--.

UNITED STATES PATENT AND TRADEMARK OFFICE
CERTIFICATE OF CORRECTION

PATENT NO. : 5,707,692

DATED : June 15, 1998

INVENTOR(S): NOBUMASA SUZUKI

It is certified that error appears in the above-identified patent and that said Letters Patent is hereby corrected as shown below:

COLUMN 8:

Line 44, "hundreds" should read --hundred--; and
Line 60, "A thick" should read --thick--.

COLUMN 9:

Line 59, "which a" should read --which an--.

COLUMN 10:

Line 6, "one" should read --that--;
Line 7, "that" should read --one--;
Line 35, "gases" should read --gas--; and
Line 40, "hundreds" should read --hundred--.

COLUMN 11:

Line 19, "cause" should read --caused--; and
Line 62, "hundreds" should read --hundred--.

COLUMN 12:

Line 7, "0.1 Tort." should read --0.1 Torr.--; and
Line 43, "Miller" should read --Mirror--.

UNITED STATES PATENT AND TRADEMARK OFFICE
CERTIFICATE OF CORRECTION

PATENT NO. : 5,707,692

DATED : June 15, 1998

INVENTOR(S): NOBUMASA SUZUKI

It is certified that error appears in the above-identified patent and that said Letters Patent is hereby corrected as shown below:

COLUMN 13:

Line 13, "with a" should read --with an--.

COLUMN 14:

Line 48, "means;" should read --means; and--;
Line 49, delete "and"; and
Line 66, "claim 7, should read --claim 9,--.

Signed and Sealed this

Sixth Day of October, 1998

BRUCE LEHMAN

*Attest:*

*Attesting Officer*    Commissioner of Patents and Trademarks